United States Patent
Nickel

(10) Patent No.: US 10,317,489 B2
(45) Date of Patent: Jun. 11, 2019

(54) METHOD AND MAGNETIC RESONANCE APPARATUS FOR DETERMINING A PHASE DESCRIBING MAP BY A MIN-CUT/MAX-FLOW

(71) Applicant: Siemens Aktiengesellschaft, Munich (DE)

(72) Inventor: Marcel Dominik Nickel, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 702 days.

(21) Appl. No.: 14/970,916

(22) Filed: Dec. 16, 2015

(65) Prior Publication Data

US 2016/0169995 A1    Jun. 16, 2016

(30) Foreign Application Priority Data

Dec. 16, 2014 (DE) .................. 10 2014 226 052

(51) Int. Cl.
 *G01V 3/00* (2006.01)
 *G01R 33/48* (2006.01)

(52) U.S. Cl.
 CPC .............. *G01R 33/4828* (2013.01)

(58) Field of Classification Search
 CPC .................................. G01R 33/4828
 USPC .................................. 324/307, 309
 See application file for complete search history.

(56) References Cited

U.S. PATENT DOCUMENTS

| | | | | |
|---|---|---|---|---|
| 9,645,215 B2* | 5/2017 | Nickel | ............ | G01R 33/4828 |
| 2014/0167755 A1 | 6/2014 | Nickel | | |
| 2014/0266192 A1* | 9/2014 | Taviani | ............ | G01R 33/4828 |
| | | | | 324/309 |
| 2015/0002148 A1* | 1/2015 | Liu | ............ | A61B 5/055 |
| | | | | 324/309 |

(Continued)

FOREIGN PATENT DOCUMENTS

EP    2 431 760 A1    3/2012

OTHER PUBLICATIONS

Soliman et al., "Max-IDEAL: A Max-Flow Based Approach for IDEAL Water/Fate Separation," Magnetic Resonance in Medicine, vol. 72, pp. 510-521 (2014).

(Continued)

*Primary Examiner* — Louis M Arana
(74) *Attorney, Agent, or Firm* — Schiff Hardin LLP

(57) ABSTRACT

In a method and apparatus for generating a phase-describing map in a firm that is usable to generate magnetic resonance (MR) image data, first and second sets of magnetic resonance echo raw data are acquired from a region of the examination subject, at two different echo times, said first and second sets of magnetic resonance echo raw data originating from two different chemical substance types. First and second image data sets of the defined region are reconstructed respectively from the first and second sets of magnetic resonance echo raw data. An energy function is determined that contains at least one term that places phase-describing values of map points of a phase-describing map in relation to each other dependent on a difference of the respective phase-describing values of the respective map points. The energy function is optimized to obtain an optimized phase-describing map.

14 Claims, 3 Drawing Sheets

(56) References Cited

U.S. PATENT DOCUMENTS

2015/0061667 A1    3/2015  Nickel
2017/0234952 A1*   8/2017  Zhang ................ G01R 33/4828
                                                            324/309

OTHER PUBLICATIONS

Xiang: "Two-Point Water-Fat Imaging With Partially-Opposed-Phase (POP) Acquisition: An Asymmetric Dixon Method", Magn. Reson. Med., vol. 56, pp. 572-584, (2006).
Berglund et al., "Two-point Dixon Method With Flexible Echo Times", Magnetic Resonance in Medicine, vol. 65, 2011, pp. 994-1004 (2011).
Eggers et al., "Dual-Echo Dixon Imaging with Flexible Choice of Echo Times", Magnetic Resonance in Medicine, vol. 65, 2011, pp. 96-107, (2011).
Ren et.al.: "Composition of adipose tissue and marrow fat in humans by 1H NMR at 7 Tesla", in: Journal of Lipid Research, vol. 49, pp. 2055-2062, (2008).
Hernando et al., "Robust Water/Fat Separation in the Presence of Large Field Inhomogeneities Using a Graph Cut Algorithm", Magnetic Resonance in Medicine, vol. 63, pp. 79-90, (2010).
Boykov et.al.: "Fast Approximate Energy Minimization via Graph Cuts", in: International Conference of Computer Vision, vol. Im, pp. 337-384; (1999).
Greig et al. "Exact Maximum A Posteriori Estimation for Binary Images", in: Journal of the Royal Statistical Society. Series B (Methodological ), vol. 51, No. 2, pp. 271-279, (1989).

* cited by examiner

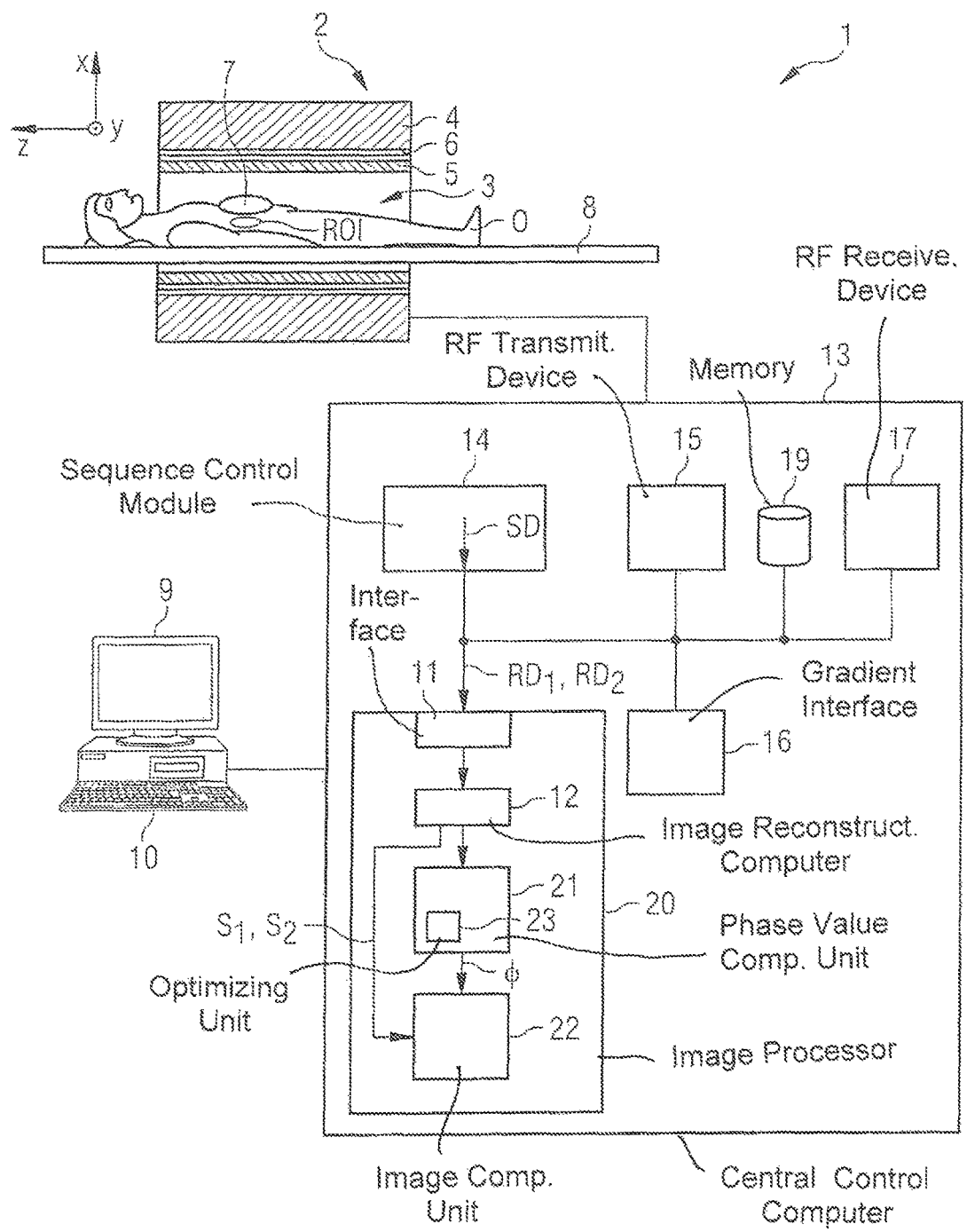

METHOD AND MAGNETIC RESONANCE APPARATUS FOR DETERMINING A PHASE DESCRIBING MAP BY A MIN-CUT/MAX-FLOW

BACKGROUND OF THE INVENTION

Field of the Invention

The invention relates to a method for determining a phase-describing map of a defined region of an object under examination by an imaging magnetic resonance scan, of the type wherein, from this phase-describing map, image data of at least two chemical substance types of the defined region, that differ from one another, such as fat and water, are generated. The invention also concerns a method for determining image data for two different chemical substance types in a defined region of an object under investigation. Furthermore, the invention concerns an image processing device for determining a phase-describing map and, where required, for generating image data of two chemical substances differing from one another of a defined region of the object under examination. The invention also concerns magnetic resonance system with such an image processing device.

Description of the Prior Art

In order to obtain magnetic resonance recordings, i.e. image data generated with a magnetic resonance tomography apparatus, from a region of the interior of the body of an object under investigation, initially the body or the body part to be investigated must be exposed to a static basic magnetic field that is as homogeneous as possible, usually designated as the $B_0$ field. This causes nuclear spins in the body to be aligned parallel to the direction of the $B_0$ field (usually designated the z-direction). Furthermore, with suitable radio-frequency antennae, radio-frequency pulses (RF pulses) are radiated into the object under investigation. The frequency of such RF pulses in the region of the resonance frequency, known as the Larmor frequency, of the nuclei to be excited in the existing magnetic field. These radio-frequency pulses excite the spins of the nuclei, in general hydrogen nuclei, in the object under investigation such that they are deflected by an "excitation flip angle" from their equilibrium position parallel to the basic magnetic field $B_0$. The nuclear spins precess initially around the z-direction and gradually relax again, with the relaxation being dependent on the molecular environment in which the excited nucleus is situated. (de.wikipedia.org/wiki/Relaxation_(NMR) The magnetic resonance signals generated during relaxation are received as "raw data" by radio-frequency receiving antennae. On the basis of the acquired raw data, the magnetic resonance images are subsequently reconstructed. The spatial encoding of the received signals takes place with the use of rapidly switched gradient magnetic fields, which are overlaid on the basic magnetic field during the transmission of the magnetic resonance radio frequency pulses and/or the acquisition of the raw data.

A widely known fundamental problem in the acquisition of the raw data is that the excited nuclei in the body tissue have no uniform resonance frequency in the magnetic field. Rather, the resonance frequency can differ for different tissue types or substance types depending on their chemical environment. This is commonly known as chemical shift. A substance type (or just substance, for short) should be understood herein, in the context of the invention, to be any type of pre-defined chemical substance or any type of atomic or molecular nucleus with particular magnetic resonance behavior. A typical example of different substance types are the substance types fat and water. A substance type may well contain a number of components that have (slightly) different resonance frequencies. For example, as described in greater detail below, the substance type can be described by a chemical spectral model with a number of peaks with regard to the resonance frequency. Thus, the different substance types also cover more complex chemical compounds or mixtures which have different components and possibly different resonance frequencies, but come together into a characteristic spectrum. Particularly relevant in magnetic resonance imaging is the chemical shift of fat tissue in relation to the usually excited water, since fat occurs in many body regions in significant quantities. The chemical shift between fat tissue and water is approximately 3.4 ppm.

There currently exist a variety of methods for generating separate magnetic resonance images of different substance types, such as for generating separate water and fat images. A typical method for achieving this is the "two-point Dixon method". In that method, raw data are recorded with suitable magnetic resonance sequences during two different echoes, for example, two different gradient echoes or spin echoes. These echoes differ in their echo time so that for one echo, the phase position of the water matches the phase position of the fat, whereas for the second echo the phase position of the water is aligned opposing the phase position of the fat. This is achieved by the echo times being exactly determined suitably in advance, and the magnetic resonance sequences being designed accordingly. Following the signal processing and the usual Fourier transformation for the reconstruction of image data from the raw data, two different types of magnetic resonance image data are obtained therefrom, specifically image data with a matching phase position, the "in-phase image", and image data with an opposing phase position, the "opposed-phase image". The signal values in the two images can be described, neglecting the tissue relaxation, as follows:

$$S_0(x)=(W(x)+F(x))e^{i\varphi_0} \quad (1)$$

$$S_1(x)=(W(x)-F(x))e^{i(\varphi_0+\varphi)} \quad (2)$$

In these equations, the water and fat content at a given image point are represented by W(x) and F(x), respectively. $S_0(x)$ and $S_1(x)$ are the intensity values in the in-phase image and in the opposed-phase image at the respective image point. An image point should be understood, for two-dimensional image data, as a pixel and, for three-dimensional image data, as a voxel. x represents the (for example, also multidimensional) coordinates of the image point. The unit in which the local coordinates are given can simply be defined by the number of image points in the respective direction. The value $\varphi_0$ denotes the phase in the image which results due to field inhomogeneities and due to the phase during the RF excitation, which can occur in the signal chain and the receiving chain. The phase rotation or phase $\varphi$ represents a further phase error mainly due to field inhomogeneities arising from eddy current effects in the case of bipolar readout schemas and due to gradient delays, which results between the in-phase echo and the opposed-phase echo. There now exist various algorithms for generating the water image W and the fat image F from the in-phase image and the opposed-phase image using equations (1) and (2). Due to possible field inhomogeneities, gradient delays, eddy currents, etc., it is very important for the two-point Dixon method to determine the global phase rotation $\varphi$ between the two echo times per image point and then to take it into account in the reconstruction. It is usually also assumed that the variation of the phase rotation is spatially weak, i.e. that the variation between adjacent image points is, for example, <180°.

A significant disadvantage of the conventional two-point Dixon method is the restriction to precisely defined echo times. This significantly reduces the degrees of freedom during the development of suitable magnetic resonance sequences. It is then no longer possible to adapt the echo times to other conditions, in order for example, to develop a particularly fast magnetic resonance sequence to achieve an optimum signal-to-noise ratio, etc.

In the article by Holger Eggers et al. "Dual-Echo Dixon Imaging with Flexible Choice of Echo Times" in Magnetic Resonance in Medicine 65, pages 96 to 107, 2011, a method is described in which the echo times can be selected more flexibly. Herein, as before, however, a relatively simple model is assumed for fat, wherein it is assumed that fat has exactly one resonance frequency line. In fact, however, it is the case that fat and many other substance types have a plurality of resonance frequencies lying close together, i.e. it would actually have to be described by a multi-peak spectral model. In EP 2 431 760 A1, Eggers therefore describes a method in which a multi-peak spectral model for fat can be used, however, so that the whole mathematical description becomes significantly more complex, in contrast to the known classical method. In order, finally, to reach a water image and a fat image, it is therefore proposed in EP 2 431 760 A1, initially to identify all voxels for which a clear mathematical solution exists and subsequently to solve the ambiguity for the other voxels. Herein, the voxels with the unambiguous solutions identified in the direct vicinity are then made use of. In order to achieve this, a correspondingly large number of voxels is required in the images for which such a mathematically unambiguous solution exists. For this purpose, it is shown that it is possible to exert an influence on the number of voxels with unambiguous solutions through a suitable selection of the echo times. It is disadvantageous that if—as distinct from the classical method—the echo times are not exactly defined but that a non-trivial constraint exists regarding the selection of the echo times.

In DE 10 2012 223 789 A1, a method for determining a phase-difference map is described wherein, with the use of the phase-difference map, a phase correction is carried out later to generate the image data of at least two mutually different chemical substance types. The determination of the correct phase values is realized in this method with the aid of a point-by-point progressive growth method, starting from points on the phase-difference map with exact solutions.

SUMMARY OF THE INVENTION

It is an object of the present invention to provide a method and an image processing device for determining a phase-describing map for a generation (immediately or later) of image data of two mutually different chemical substance types, which enable a selection of echo times with the highest possible accuracy in a wide range, preferably almost arbitrarily selectable echo times, and that are distinguished by improved effectiveness.

The method according to the invention for determining the phase-describing map has the following method steps.

Initially, first and second sets of magnetic resonance echo raw data (referred to herein as "echo data") of the desired defined region, are acquired respectively at two different arbitrary echo times. The acquisition of the echo data as used herein means the acquisition of the echo data with the magnetic resonance apparatus. In principle, these sets of echo data can have been acquired in advance and transferred to a computer, for example from the image processing device, via a suitable interface.

Then, first and second image data are reconstructed from the echo data by the computer in the usual manner. This is similar to the aforementioned in-phase and opposed-phase images, although now, since the echo times are freely selectable, it is not essential for the signals of the two substance types to be present for which image data are in phase and other image data having an opposite phase, but rather it is sufficient that different phases exist.

The phase-describing map can have values for image points or groups of image points that have an absolute phase, or alternatively phase-difference values. These phase values or phase-difference values can be, for example, the phase value $\varphi_0$ or the phase value $\varphi$ or the difference between these two values for each point or each group of image points. The phase-describing map can also have a lower resolution than the image to be determined with its help. Individual phase-describing values of the phase-describing map can then be determined as values averaged over a number of image points. In this way, the signal-to-noise ratio can be improved in the determination of the phase-describing map and consequently in the determination of the image data for the chemical substance types, i.e. the intensity values for the respective images of the substance types.

Furthermore, in the context of the method, an energy function is established that contains at least one term that places phase-describing values of preferably adjacent map points, i.e. adjacent image points or image point groups of the phase-describing map, in relation, and depends on a difference of the phase-describing values of the respective map points. This term can be regarded as a term of the phase-describing values of the map or phase map that forces smoothing.

In a further step, the energy function for obtaining an optimized phase-describing map making use of a min-cut/max-flow method, also known as a min-cut/max-flow algorithm, is optimized, preferably minimized. At the start of the optimization process, for example, a phase-describing start map can be used which comprises start values, e.g. minimum values of the phase-describing values. Starting values can be determined by computation with the aid of equations (1) and (2) or with the help of analogous equations in a complex spectral model, as will be shown in detail below. Normally, for each point of the phase-describing start map, a maximum of two candidate values are determined. Then, with the aid of the optimization process, for each point of the phase-describing map, one of these two candidate values is determined as the correct value.

The method according to the invention also allows a phase-describing map to be generated in a simple manner for arbitrary echo times, on the basis of which the different separate image data of the two chemical substance types, for example, a water image and a fat image, can subsequently be generated. With the use of an arbitrary signal model, the method can be very accurate, since a signal model can be used which enables the best possible adaptation to the real conditions, for example, a multi-peak signal model. In contrast to the method with the selection of the echo times, due to the procedure according to the invention for creating the phase-describing map, it is not strictly necessary to reach a large number of image points for which a mathematically unambiguous solution exists. In principle, this method can even function if no mathematically unambiguous solution exists even for a single image point. Thus, with regard to the use of the Dixon method according to the invention, there are no more constraints with respect to the selection of the echo times. This allows, during the design of the magnetic resonance sequences, the echo times to be optimized in other respects, for example, the highest possible speed of the sequence or the best possible signal-to-noise ratio of the signals obtained. Compared with the point-by-point progressive growth method as described in DE 10 2012 223 789 A1, the method according to the invention has the advantage that it is significantly more stable in practice. In particular, in the method according to the invention, fewer phase wraps/swaps (phase exchanges) are seen. In contrast to the growth method, according to the invention there is no local dependency on the selection of starting points. The problem of the occurrence of inconsistencies in later growth steps, as can occur in the growth method, is prevented with the method according to the invention.

The method according to the invention has proven to be very robust in comparison with the conventional approaches, particularly with regard to fat-water swaps.

The method according to the invention can advantageously be used, as mentioned above, for the determination of separate sets of image data for the two different chemical substance types in a defined region of the object under investigation. For this purpose, based on the first and second sets of image data, i.e. the intensity values for the individual image points of the defined region reconstructed from the first and second sets of magnetic resonance echo raw data and based on the phase-describing map, the image data for each of the chemical substance types, i.e. the intensity values for the respective images of the substance types, are determined.

An image processing device according to the invention for determining a phase-describing map and, where required, for generating image data of two chemical substance types differing from one another of a defined region of the object under examination has, inter alia, the following components.

Firstly, an interface to a computer is required for receiving first and second sets MR echo data of the defined region of two different echo times.

Furthermore, the computer of the image processing device has an image data reconstruction stage or module or processor that is configured for reconstruction of first and second sets of image data of the defined region on the basis of the first and second sets of MR echo data.

According to the invention, a phase value computation stage or module or processor is also required, which is configured to establish an energy function that contains at least one term that places phase-describing values of image points or image point groups of the phase-describing map in relation, and depends on a difference of the phase-describing values of the respective image points or image point groups.

Furthermore, the image processing device according to the invention has an optimizing stage or module or processor that is configured to optimize the energy function for obtaining an optimized phase-describing map, making use of a min-cut/max-flow method.

Insofar as the image processing device is also suitable for generating separate image data of two mutually different chemical substances on the basis of the phase-describing map, the image processing device (optionally) also has an image computation stage or module or processor that is configured to compute the image data for the chemical substance types on the basis of the phase-describing map and on the basis of the first and second sets of image data of the defined region The image processing device normally also has suitable output interfaces. For example, an interface in order to transfer the phase-describing map created to another unit which can then generate the image data of the different chemical substance types. When the image processing device itself generates the image data of the two mutually different chemical substance types, it has a suitable output interface for the generated image data so that they can then be stored and/or presented to an operator and/or sent via a network to further sites, where required, for further processing and/or presentation.

A magnetic resonance apparatus according to the invention has a basic field magnet with which a basic magnetic field is produced in the patient scanning space in the usual manner, a transmitter antenna system with which the radio-frequency signals are emitted, a gradient system with a number of gradient coils, a radio-frequency receiving antenna system and a suitable control computer that controls all the components. The apparatus additionally has an image processing device as described above. The magnetic resonance system of this type can naturally also have a number of further components not described in detail, which are known to those skilled in the art.

The basic components of the image processing device can be configured primarily in the form of software components of the computer. This applies in particular to the image data reconstruction module, the phase value computation module, the optimizing module and the optional image computation module. These components can also be realized in part, particularly if particularly fast calculation is to be performed, in the form of software-supported hardware, for example, FPGAs or the like. If, for example, only a transfer of data from other software components is needed, the required interfaces can also be configured as software interfaces. They can also be configured as interfaces constructed with hardware, which are controlled by suitable software.

As mentioned, an image processing device of this type can be connected either independently as an image computer, to a suitable network, for example, a radiological information system (RIS) to which the magnetic resonance system is also connected, in order to supply the necessary data from there to the image processing device. In principle, however, the image processing device can also be realized within a control device of the magnetic resonance apparatus, wherein a number of components that are already present can also be used.

A realization largely through software has the advantage that conventionally used image processing devices and/or magnetic resonance system control devices can be upgraded by simple means with a software update in order to operate in the manner according to the invention. The above object therefore also achieved in accordance with the invention by a non-transitory, computer-readable data storage medium that is loadable directly into a memory of a programmable computer, the storage medium being encoded with program code that causes the computer to carry out all the steps of the method according to the invention when the program code is executed.

The described embodiments and developments of the method according to the invention apply to the other aspects of the invention as well. The different features of different exemplary embodiments can also be combined to form further exemplary embodiments.

In a preferred embodiment of the method according to the invention, before the optimization the energy function is placed in a form in which it is optimizable with a known min-cut/max-flow method. The energy function can have, for example, the following form:

$$E = \sum_{x,y} \omega_{xy}(\varphi(x) - \varphi(y))^2 \quad (3)$$

wherein x, y are preferably adjacent voxels or image points or indices thereof in the phase-describing map, $\omega_{x,y}$ are derivatives of the phase values or phase-describing values between adjacent image points or voxels and can also contain information relating to the images, for example, the similarity of adjacent signals. The values $\varphi(x)$, $\varphi(y)$ symbolize values which are taken from the set of possible solutions for the phase values. This set comprises for each image point or each image point group, a maximum of two values.

In order to optimize the energy term, an iteration is used, wherein for each step for each image point/voxel, a selection is made between two possible phase values. If, for example, $\varphi_1(x)=\varphi(x)$ applies as a current set of phase-describing values, then closest neighbors thereof can deviate by $$\Delta(x)=\varphi_2(x)-\varphi_1(x) \quad (4)$$

It is required herein that each $\Delta(x)$ has the same sign. With this definition, a phase-describing value can be written as $$\Delta\varphi(x)=\varphi_1(x)+n(x) \quad (5)$$

wherein $n(x)\in\{0,1\}$ is a binary map.

In this way, the energy E can be written as follows:

$$E = \sum_{x,y} \omega_{x,y}(\varphi_1(x) - \varphi_1(y))^2 + \quad (6)$$
$$2\sum_{x,y} \omega_{x,y}(\varphi_1(x) - \varphi_1(y))(n(x)\Delta(x) - n(y)\Delta(y)) +$$
$$\sum_{x,y} \omega_{x,y}(n(x)\Delta(x) - n(y)\Delta(y))^2$$

Re-writing, this function can be expressed in the following form:

$$E = \quad (7)$$
$$\sum_{x,y} \omega_{x,y}(\varphi_1(x) - \varphi_1(y))^2 + \sum_{x,y} (\omega_{x,y} + \omega_{y,x})(\Delta(x) - \Delta(y))\Delta(x)n(x)^2 +$$
$$2\sum_{x,y} (\omega_{x,y} + \omega_{y,x})(\varphi_1(x) - \varphi_1(y))\Delta(x)n(x) +$$
$$\sum_{x,y} \omega_{x,y}\Delta(x)\Delta(y)(n(x) - n(y))^2$$

This term has the form:

$$E = \alpha + \frac{1}{2}\sum_{x,y} \beta_{x,y}(n(x) - n(y))^2 + \sum_x \gamma_x n(x) \quad (8)$$

Herein, for $\omega_{x,y}>0$ and the above-mentioned constraint for $\Delta(x)\beta_{x,y}>=0$.

For this form, a standard min-cut/max-flow method is known, as described by Diego Hernando, P. Kellman, J. P. Haldar and Z.-P. Liang in "Robust Water/Fat Separation in the Presence of Large Field Inhomogeneities Using a Graph Cut Algorithm", Magnetic Resonance in Medicine 63:7990 (2010).

Preferably, the energy function is a convex function or a submodular function. For a function of this type, a minimum can be determined unambiguously.

In a particularly effective embodiment of the method according to the invention, the optimization is carried out as an iterative process with the use of the min-cut/max-flow method. Herein, in each iteration step, the phase-describing values of the map are modified according to a defined modification schema until no further phase change is discernible in the current iteration step as compared with the preceding iteration step. Alternatively, the iteration can be terminated after a pre-determined number of iteration steps. A modification schema in this context should be understood to be a rule according to which the phase values of the phase-describing map are modified in the context of the min-cut/max-flow method.

The optimization with the use of the min-cut/max-flow method can be carried out particularly advantageously as an iterative method with different modification schemas. Vividly expressed, in an inner loop, the iterative optimization of the phase values is carried out and in an outer loop, different modification schemas of the phase values on which the inner loop is based are used for this optimization. In the embodiment described of the method according to the invention, the min-cut/max-flow method described is carried out sequentially with different modification schemas regarding the change in the phase values of the phase-describing map. The optimization preferably ends only when the min-cut/max-flow method has been carried out with all these modification schemas and no further improvement or modification in the phase-describing values of the phase-describing map is discernible in the context of the optimization process.

Preferably, the energy function has a term that represents the square of the phase difference of adjacent map points. The optimization of the phase values of the individual map points can be expressed as smoothing of the phase map.

As start values for a start map for the optimization step, for example, phase-describing candidate values can be determined. A possible approach for determining these candidate values is described below.

Where an arbitrary spectral model is to be used as the signal model, as is provided as an option for the invention, the equations (1) and (2) described above which indeed are not utilized for a pure generation of image data that are initially in phase and then in an opposed phase, may not be called upon. In this event, complicated complex-valued equations must be used in order to describe the signals correctly. For example, the complex-valued signals $S_1(x)$ and $S_2(x)$ at an image point having the coordinates v can be described with the equation $$S_1(x)=(W(X)+c_1F(x))e^{i\varphi_1(x)} \quad (9)$$

$$S_2(x)=(W(x)+c_2F(x))e^{i\varphi_2(x)} \quad (10)$$

Herein again, W(x) denotes the water content and F(x) denotes the fat content at the respective image point. In principle, however, W(x) and F(x) can also denote any other types of chemical substance. Solely for simplicity, the usual notation for water and fat is used since this is the most common case. In equations (9) and (10), $c_1$ and $c_2$ are complex coefficients which depend on the echo time and the spectrum of the second chemical substance (i.e. here, for example, the spectrum of fat F). In equations (9) and (10), it is also assumed for the sake of simplicity that only for one of the two chemical substance types, herein the fat F, is a complex spectrum present. In principle, however, this method can be extended to other substance types and, in this case, a complex-valued coefficient would also have to be inserted before the W-component in equations (9) and (10). Furthermore, in equations (9) and (10), it is assumed that the phases or phase rotations of the signals are each given by $\varphi_1(x)$ and $\varphi_2(x)$.

The complex coefficients $c_1$ and $c_2$ are preferably given by the equations $$c_1 = \sum_m w_m e^{i\Theta_{m,1}} \tag{11}$$

$$c_2 = \sum_m w_m e^{i\Theta_{m,2}} \tag{12}$$

Herein, m is the respective number of peaks used in the spectral model for the second chemical substance. The coefficients $w_m$ are weighted so that the sum of $w_m$ over all m is equal to 1. Furthermore, $\Theta_{m,1}=2\pi \cdot \Delta f_m \cdot TE_1$ and $\Theta_{m,2}=2\pi f_m \cdot TE_2$ are the dephasings dependent on the echo times, wherein $\Delta f_m$ (e.g. in $s^{-1}$) is the respective offset in the resonance frequency for the m-th peak of the spectrum of the second chemical substance, thus in this case the fat, in relation to the water peak and $TE_1$ and $TE_2$ are the (freely selectable) echo times of the first and second echoes (each e.g. in ms). Thus, for at least one of the two substances, a multipeak spectral model is preferably used as the signal model. If the echo times and the spectrum are known, the two coefficients $c_1$, $c_2$ can be calculated for each concrete case with equations (11) and (12) and inserted into equations (9) and (10). Suitable models from which the number of peaks, the offset frequencies $\Delta f_m$ and the appropriate weighting factors $w_m$ can be found are known in the literature and are described, for example, in Ren J. et al., Journal of Lipid Research 2008; 49:2055-2062. For further explanation of the theory lying behind this, reference can also be made to EP 2 431 760 A1.

As mentioned above, however, the method according to the invention is not restricted to a multipeak spectral model. Thus, in a simpler variant, a model with only one peak could also be made use of. For a mathematical description, m=1 could then be used in equations (11) and (12) and thus $w_m$ be set=1, so that these equations become simplified as follows:

$$c_1 = e^{i\Theta_1} \tag{11'}$$

$$c_2 = e^{i\Theta_2} \tag{12'}$$

Accordingly, $\Theta_1=2\pi \cdot \Delta fm \cdot TE_1$ and $\Theta_2=2\pi \cdot \Delta f_m \cdot TE_2$ again are the dephasings or phase rotations dependent on the echo times, wherein $\Delta f$ here is the offset in the resonance frequency for the only peak of the spectrum of the second chemical substance, thus in this case the fat, in relation to the water peak and $TE_1$ and $TE_2$ are the (freely selectable) echo times of the first and second echoes.

Preferably, smoothing of the phase-describing map takes place, for example, by low-pass filtering. For this purpose, for example, the phase-describing values can again be replaced at the individual points by mean values from a defined environment.

The aforementioned known determination of phase-describing maps on the basis of in-phase and opposed-phase images is based on the model assumption that by the suitable selection of the echo times, the water and the fat have a magnetization which is either parallel or antiparallel. Thus, in particular, the phase of the parallel case can be used to calculate a phase difference per pixel. This phase difference can then be used in order to carry out the phase correction. In the case of arbitrary echo times and/or of a complicated spectral model for arbitrary chemical substance types, this assumption is no longer automatically justified and the calculations are significantly more complex. This is due to the fact that—as stated above—in place of the aforementioned equations (1) and (2), for example, complex-valued equations (9) and (10) must now be constructed in order to describe the situation adequately. Herein, it is the object, from the scanned complex-valued data $S_1(x)$ and $S_2(x)$, to determine the parameters $\varphi_1(x)$ and $\varphi_2(x)$ as well as $W(x)$ and $F(x)$ of the equations (9) and $F(x)$ of the equations (9) and (10). For this purpose, initially the values $$|S_1(x)|=|W(x)+c_1F(x)| \tag{13}$$

$$|S_2(x)|=|W(x)+c_2F(x)| \tag{14}$$

of the measured data $S_1(x)$ and $S_2(x)$ can be observed. This equation system has up to two solutions $\{W_{K1}(x), F_{K1}(x)\}$ and $\{W_{K2}(x), F_{K2}(x)\}$ with a positive real-value part of (for example) fat, which are given by $$F_{K1} = \sqrt{\frac{-a_2 + \sqrt{-a_2^2 - 4a_1a_3}}{2a_1}} \tag{15}$$

$$F_{K2} = \sqrt{\frac{-a_2 - \sqrt{-a_2^2 - 4a_1a_3}}{2a_1}} \tag{16}$$

$$W_{K1} = \frac{|S_1|^2 - |S_2|^2 - (|c_1|^2 - |c_2|^2)F_{K1}^2}{2\Re(c_1 - c_2)F_{K1}} \tag{17}$$

$$W_{K2} = \frac{|S_1|^2 - |S_2|^2 - (|c_1|^2 - |c_2|^2)F_{K2}^2}{2\Re(c_1 - c_2)F_{K2}} \tag{18}$$

Herein $$a_1 = \tag{19}$$
$$(\Re(c_1)^2 - \Im(c_1)^2 - 2\Re(c_1)\Re(c_2) + |c_2|^2)^2 + 4(\Re(c_1 - c_2))^2\Im(c_1)^2$$

$$a_2 = 2(\Re(c_1)^2 - \Im(c_1)^2 - 2\Re(c_1)\Re(c_2) + |c_2|^2)(|S_1|^2 - |S_2|^2) - \tag{20}$$
$$4(\Re(c_1 - c_2))^2|S_1|^2$$

$$a_3 = (|S_1|^2 - |S_2|^2)^2. \tag{21}$$

In equations (17) to (20), the real part is denoted by $\Re$ and the imaginary part by $\Im$. With these equations, for the phase differences that predominantly are initially to be correctly determined in the context of the present invention for each image point, again a maximum of two possible solutions are obtained $$e^{i(\varphi_2(x)-\varphi_1(x))}|_{erste\ Lösung} = \frac{S_1(x)^*S_2(x)}{(W_{K1}(x) + c_1^*F_{K1}(x))(W_{K1}(x) + c_2F_{K1}(x))} \tag{22}$$

$$e^{i(\varphi_2(x)-\varphi_1(x))}|_{zweite\ Lösung} = \frac{S_1(x)^*S_2(x)}{(W_{K2}(x) + c_1^*F_{K2}(x))(W_{K2}(x) + c_2F_{K2}(x))} \tag{23}$$

Herein, the upper index * symbolizes the conjugate value. The equations (22) and (23) therefore supply the aforementioned phase-describing candidate values. The equations (15) to (18) deliver suitable candidate image data of the chemical substance types for the phase-describing candidate values, i.e. with the above equations, the possible solutions for the water image and the fat image that would result at each image point for the two phase-describing candidate values are also determined similarly for each image point.

When it has been unambiguously determined which of the two solutions (22) or (23) describes the phase difference at an image point in the correct way, which can be determined by the optimization process described above, it can subsequently also be determined which of the two solutions $\{W_{K1}(x), F_{K1}(x)\}$, $\{W_{K2}(x), F_{K2}(x)\}$ according to equations (15) to (18) is correct. In order to discover the correct one of the two solutions (22) or (23), i.e. the correct phase-describing candidate value, as mentioned above, in the context of the invention, the optimization process according to the invention is used.

By multiplication of $S_1(x)$ from the above equation (9) by the correct solution of the phase $e^{i(\varphi_2(x)-\varphi_1(x))}$ obtained (with the aid of the optimization process described) as well as a simple renaming of the equation (11), the following equations are obtained $$\tilde{S}_1(x) = (W(x) + c_1 F(x)) e^{i\varphi_2(x)} \quad (24)$$

$$\tilde{S}_2(x) = (W(x) + c_2 F(x)) e^{i\varphi_2(x)} \quad (25)$$

In this equation system (24), (25) the unwanted phase difference or the two phases $\varphi_1$ and $\varphi_2$ no longer exist, but rather just one phase $\varphi_2$. Thus, in a next step, the desired water image $W(x)$ and fat image $F(x)$ are calculated. For the calculation, apart from the solution based on equations (15) to (18), alternatively, equations (24) and (25) are also converted according to $W(x) e^{i\varphi_2(x)}$ and $F(x) e^{i\varphi_2(x)}$ and subsequently, the value of these solutions can be taken. The latter approach has proved in practice to be less noise-prone.

In a second alternative use of the method according to the invention, the start values for the iteration process are not determined with the aid of the equations (22), (23), but rather arbitrary phase-describing values are permitted as start values. In this embodiment of the method according to the invention, the energy function also has a term which describes the local data consistency of a phase-describing value. In this case, the energy term is given by $$E = \sum_{x,y} \omega_{xy} (\varphi(x) - \varphi(y))^2 + \sum_x \chi^2(\varphi(x)) \quad (26)$$

Herein, the $\chi^2(\varphi(x))$ term gives the best data consistency for a voxel x for the given phase-describing value $\varphi(x)$. This term is periodic with a period of $2\pi$ and has a maximum of two minima in an interval of $2\pi$. The $\chi^2(\varphi(x))$ term can be determined, for example, as described in the patent application DE 10 2013 217 650.3.

In this version, there is a non-convex optimization problem which makes it difficult to find a global minimum with conventional methods. However, this difficulty can be overcome with the aid of the optimization process utilized according to the invention while using a min-cut/max-flow method.

It is preferred in this version to use as the start values for the phase-describing values, the minima of the aforementioned $\chi^2(\varphi(x))$ function.

The modification schemas of the phase-describing values used in the optimization step according to the invention can comprise the following patterns for the variant using the energy term according to equation (3): a jump of the phase-describing values to the next larger permitted phase, a jump of the phase-describing values to the next smaller permitted phase, increasing the phase-describing values by $2\pi$, decreasing the phase-describing values by $2\pi$. Furthermore, a pattern can be used wherein initially all the points are determined for which a phase jump of large value ($2\pi$ or a user-defined threshold value) comes from the preceding and following value in one dimension direction. For these points, the value to the next smaller permitted phase is used and for all others, a value of $2\pi$. This last schema addresses local minima of the iteration schema and it can be shown that it is not necessary for the case in equations (1) and (2), since in this case also, with the remaining patterns, a global minimum is reached.

The modification schemas of the phase-describing values used in the optimization step according to the invention can include the following patterns for the variant using the energy term according to equation (26): a jump of the phase-describing values to the next larger minimum of the energy function, a jump of the phase-describing values to the next smaller minimum of the energy function, increasing the phase-describing values by $2\pi$, decreasing the phase-describing values by $2\pi$, increasing the phase-describing values by a pre-determined increment, decreasing the phase-describing values by a pre-determined increment, a jump of the phase-describing values by $2\pi$ at the next-but-one neighbors.

The determination of the image data (W, F) for the chemical substance types can alternatively take place by means of an optimization process.

In this variant of the method, for each image point, the norm $$\chi^2(\varphi(x)) = \min_{W(x), F(x), \varphi_1(x)} (|S_1(x) - (W(x) + c_1 F(x)) e^{i\varphi_1(x)}|^2 + |S_2(x) - (W(x) + c_3 F(x)) e^{i(\varphi_1(x) + \varphi(x))}|^2) \quad (27)$$

is calculated. Minimization of the parameters $W(x)$, $F(x)$ and $\varphi_1(x)$ can be carried out analytically.

BRIEF DESCRIPTION OF THE DRAWINGS

FIG. 3 is a schematic representation of a magnetic resonance system according to an exemplary embodiment of the invention.

DESCRIPTION OF THE PREFERRED EMBODIMENTS

In the following description, it is assumed (without restricting the generality of the invention) that the chemical substances are water and fat.

Figure 1:
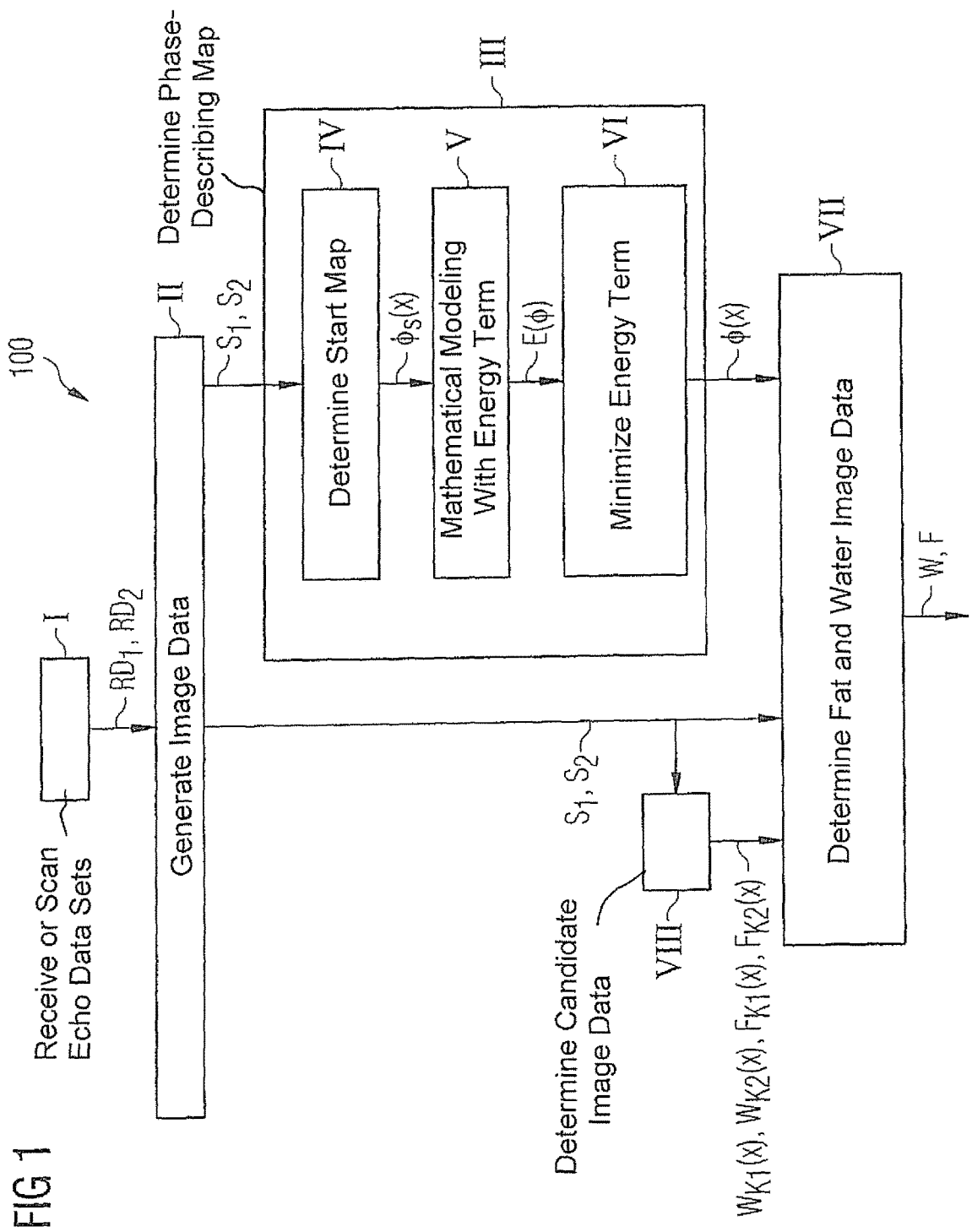
FIG. 1 is a flowchart with which a sequence of an exemplary embodiment of a method according to the invention for determining a phase-describing map and generation of separate image data of two chemical substances.

As shown in FIG. 1, the method 100 begins at the method step I with the acceptance or scanning of echo data sets $RD_1$, $RD_2$ from a defined region from which the image data are to be generated, wherein the echo data sets $RD_1$, $RD_2$ have been or are recorded with arbitrary different echo times. Since the echo times can be selected, an arbitrary magnetic resonance sequence can be used, such as a spin echo sequence, turbo spin echo sequence, gradient echo sequence, etc.

In a step II, next, complex image data $S_1$, $S_2$ of the defined region are generated on the basis of the first and second sets of MR echo data. These image data $S_1$, $S_2$ are then used at different points within the method.

Based on these image data $S_1$, $S_2$, in a step III, the desired phase-describing map $\Phi$ is determined. Herein, according to the invention, a min-cut/max-flow method is used as an optimization process for determining the phase-describing values $\varphi(x)$ of the phase-describing map $\Phi$. Furthermore, based on the complex image data $S_1$, $S_2$, later in step VII, subsequently taking account of the phase-describing map $\Phi(x)$, the desired fat and water image data W, F are generated.

Method step III, in which the phase-describing map $\Phi(x)$ is determined, begins initially with a method step IV in which a start map $\Phi_s(x)$ with start values $\varphi_s(x)$ is determined. The start values $\varphi_s(x)$ can be calculated, for example, as the possible solutions of the equations (22) and (23), i.e. the describing candidate phase values $\varphi_{K1}(x)$, $\varphi_{K2}(x)$ for each image point. As described, a maximum of two solutions for W(x), F(x) and corresponding candidate values $\varphi_{K1}(x)$, $\varphi_{K2}(x)$ can be calculated from the value of the signals $S_1(x)$ and $S_2(x)$.

As mentioned, there may be only one, or even no, exact solution as a function of the value of the quotient of the signals $S_1(x)/S_2(x)$. If there is only one solution, then there is no problem, since this solution is unambiguous. However, it can be used in the further method, initially as a "candidate phase difference value". The problem then lies in the selection of the correct solutions.

Alternatively, the start values $\varphi_s(x)$ can also be determined as minima of the $\chi^2(\varphi(x))$ function occurring in equation (26).

Subsequently, in step V with the aid of an energy term $E(\varphi)$, mathematical modeling which is dependent on the phase difference of adjacent voxels x, y is carried out. This term can possibly also include a $\chi^2(\varphi(x))$ function.

In step VI, finally, the energy term $E(\varphi)$ is minimized with the use of a min-cut/max-flow method. Herein, it underlies this method that the variation in the phase varies weakly spatially.

Figure 2:
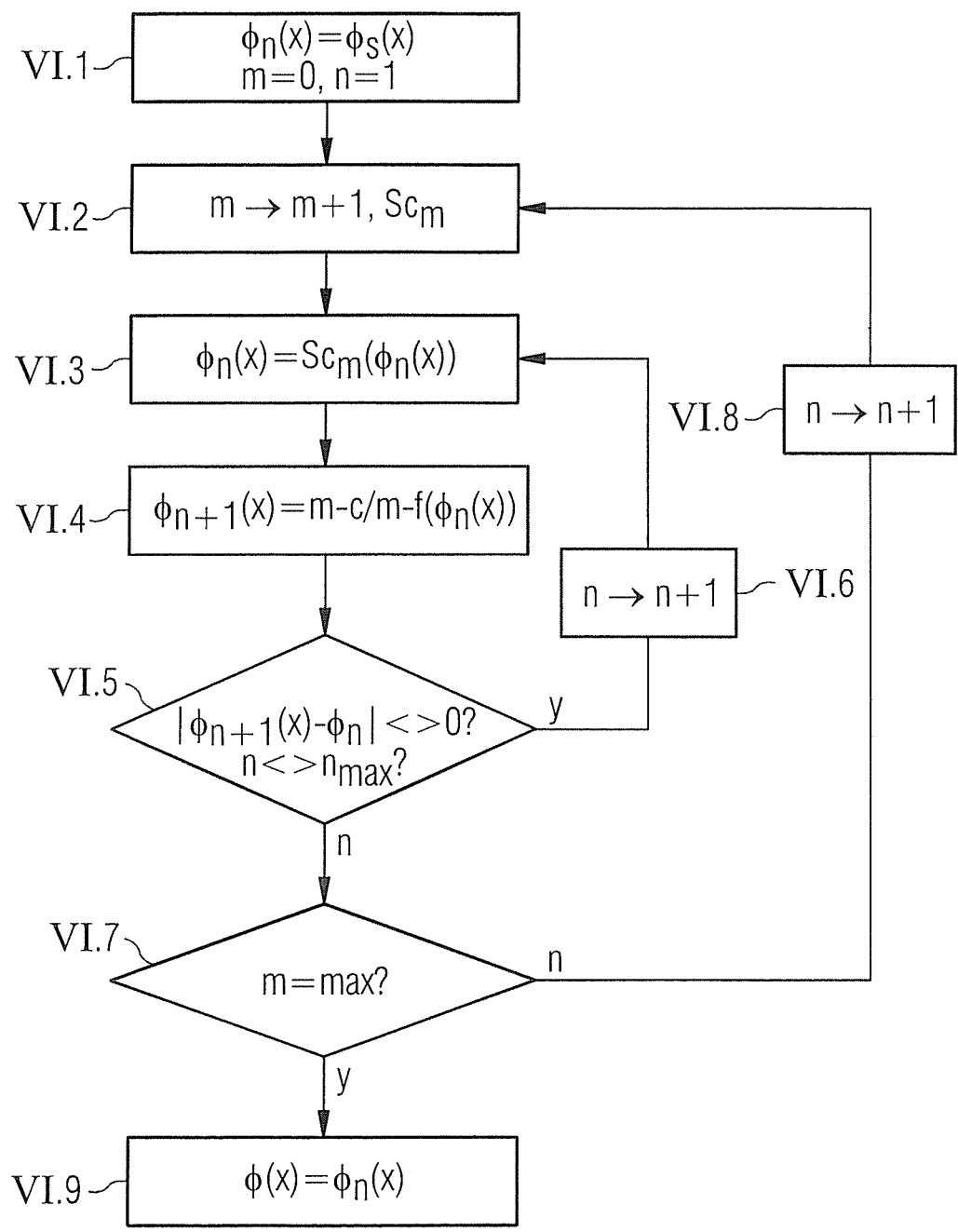
FIG. 2 is a flowchart for a possible sequence of a method within the method step VI in the method according to FIG. 1.

The exact procedure in step VI is illustrated in a flow diagram in FIG. 2. In step VI.1, the start values $\varphi_s(x)$ determined are used for initializing the method. Subsequently, in step VI.2, a schema $Sc_m$ is selected from a group of schemas $Sc_m$, wherein m=1 to max, where max=the number of existing schemas. The schema $Sc_m$ comprises a rule in each case, according to which the phase-describing values $\varphi_n(x)$ are modified in each iteration pass.

If in step IV, candidate values $\varphi_{K1}(v)$, $\varphi_{K2}(v)$ according to equations (22), (23) have been calculated as starting values $\varphi_s(x)$, the set of schemas $Sc_m$ can include the following schemas:

$\varphi_n=\varphi_{K1} \rightarrow \varphi_n=\varphi_{K2}$ (Sc$_1$)

$\varphi_n=\varphi_{K2} \rightarrow \varphi_n=\varphi_{K1}$ (Sc$_2$)

$\varphi_n \rightarrow \varphi_n+2\pi$ (Sc$_3$)

$\varphi_n \rightarrow \varphi_n-2\pi$ (Sc$_4$)

Jump by $2\pi$ for next-but-one neighbors (Sc$_5$)

If the energy term or the energy functional $E(\varphi)$ comprises a $\chi^2(\varphi(x))$ function and in step IV phase-describing values were determined as the starting values $\varphi_s(x)$ either arbitrarily or, for example, as minima of the $\chi^2(\varphi(x))$ function occurring in equation (26), then the set of schemas $Sc_m$ can include the following schemas:

$\varphi_n=\varphi_{min1} \rightarrow \varphi_n=\varphi_{min2}$ (Sc$_1$*)

$\varphi_n=\varphi_{min2} \rightarrow \varphi_n=\varphi_{min1}$ (Sc$_2$*)

$\varphi_n \rightarrow \varphi_n+2\pi$ (Sc$_3$*)

$\varphi_n \rightarrow \varphi_n-2\pi$ (Sc$_4$*)

Jump by $2\pi$ for next-but-one neighbors (Sc$_5$)

$\varphi_n \rightarrow \varphi_n+\Delta\varphi$ (Sc$_6$)

$\varphi_n \rightarrow \varphi_n-\Delta\varphi$ (Sc$_7$)

wherein $\Delta\varphi$ is a small pre-determined increment of the phase $\varphi$.

In step VI.3, the modification schema $Sc_m$ is applied to the phase-describing values $\varphi_n(x)$. For example, in a first iteration step, the schema $Sc_1$ is applied to the phase-describing values $\varphi_n(x)$. In specific terms, this means that all $\varphi_n(x)=\varphi_{K1}$ are modified into $\varphi_{K2}$.

In step VI.4, the minimization of the energy term $E(\varphi)$ is carried out with the use of a min-cut/max-flow algorithm. As a result of the minimization, optimized phase-describing values $\varphi_{n+1}(x)$ on which the further iteration is based are determined.

In step VI.5, it is determined whether the optimized phase-describing values $\varphi_{+1}(x)$ still deviate from the preceding phase-describing values $\varphi_n(x)$ or whether the number of iteration steps already performed is smaller than a maximum number of iteration steps $n_{max}$. If this is the case, as indicated in FIG. 2 by "y", then in step VI.6, the optimized phase-describing values $\varphi_{n+1}(x)$ are set as new phase-describing values to be optimized and control returns to step VI.3, wherein the new phase-describing values are subjected to a modification schema $Sc_m$, i.e. so that the new phase-describing values are modified, for example, according to the schema $Sc_m$. Subsequently, in step VI.4, the energy term $E(\varphi)$ is minimized with the use of a min-cut/max-flow method, wherein in this minimization step, the modified phase-describing values subjected to the schema $Sc_m$ are taken as the basis.

In step VI.5, it is again checked whether the optimized phase-describing values $\varphi_{n+1}(x)$ still deviate from the preceding phase-describing values $\varphi_n(x)$ or whether a maximum number $n_{max}$ of iteration steps has already been performed. If this is no longer the case, which is indicated in FIG. 2 by "n", then control passes to step VI.7, where it is determined whether all the modification schemas $Sc_m$ have already been applied to the phase-describing values $\varphi_n(x)$. If this is no longer the case, which is indicated in FIG. 2 by "n", then control passes to step VI.8. In step VI.8, similarly to step VI.6, the optimized phase-describing values $\varphi_{n+1}(x)$ are set as new phase-describing values to be optimized. Subsequently, the method returns to step VI.2 in which a new modification schema $Sc_m$ is defined for the phase-describing values $\varphi_n(x)$. Subsequently, in step VI.3, this new modification schema $Sc_m$ is applied to the optimized phase-describing values $\varphi_n(x)$. In step VI.4, the min-cut/max-flow method for minimizing the energy term $E(\varphi)$ is applied to the thus modified phase-describing values $\varphi_n(x)$. If it is determined in step VI.5 that the new phase-describing values $\varphi_{n+1}(x)$ obtained from VI.4 no longer differ from the preceding values $\varphi_n(x)$, as identified in FIG. 2 by "n", then control passes to step VI.7. If it is determined in step VI.7 that all the modification schemas have already been tested, which is indicated in FIG. 2 by "y", then control passes to step VI.9. In step VI.9, the phase-describing values $\varphi_n(x)$ most recently obtained in the iteration process as final phase-describing values of the phase-describing map $\Phi(x)$ are stipulated.

As shown in FIG. 1, this phase-describing map $\Phi(x)$ can be used together with the initially reconstructed first and second image data $S_1(x)$, $S_2(x)$ in order to calculate the desired fat and water images $F(x)$ and $W(x)$ (step VII). This can take place directly by solving equations (23), (24) or by an alternative non-linear optimization process according to equation (27).

If the iteration process according to equation (27) is used to determine the desired separate fat and water images $F(x)$ and $W(x)$, then in step VIII of FIG. 1, candidate image data $W_{K1}(x)$, $W_{K2}(x)$, $F_{K1}(x)$, $F_{K2}(x)$ are determined from the signals $S_1$ and $S_2$ as start values for the optimization process according to equation (27). This determination of the start values can take place, for example, with the use of the method described above referring to equations (24) and (25), wherein the candidate image data $W_{K1}(x)$, $W_{K2}(x)$, $F_{K1}(x)$, $F_{K2}(x)$ determined in step VIII can be used as start values.

The method according to the invention has proved to be extremely robust and is also able to generate very good water and fat image data if echo times are selected so that an unambiguous solution cannot be determined for any of the image points.

Finally, in FIG. 3, shown in a schematic form is a magnetic resonance system 1 according to the invention (hereinafter known, for short, as "MR system") with which the method according to the invention can be carried out. The system 1 has the actual magnetic resonance scanner 2 with an examination space 3 or patient tunnel extending in the z-direction into which, placed on a bed 8, a patient or test subject O or other examination object in whose body the region of interest ROI, for example, a particular organ is situated, can be moved.

The magnetic resonance scanner 2 is equipped in the usual manner with a basic field magnet 4, a gradient arrangement 6 and an RF transmitter antenna 5 and an RF reception antenna 7. In the exemplary embodiment shown, the RF transmitter antenna 5 is a whole body coil fixedly incorporated in the magnetic resonance scanner 2, whereas the RF receiving antenna 7 is composed of local coils to be arranged at the patient or test subject (in FIG. 3 symbolized only by a single local coil). In principle, however, the whole body coil can also be used as an RF receiving antenna and the local coils can be used as an RF transmitter antenna, provided these coils are each switchable into different operating modes.

The MR system 1 also has a central control computer 13 that is used for controlling the MR scanner 2. This central control computer 13 has a sequence control module 14 for pulse sequence control. With this, the sequence of radio-frequency pulses (RF pulses) and gradient pulses can be controlled depending on a selected imaging sequence. An imaging sequence of this type can be pre-set within a scan protocol or control protocol that is stored, for example, in a memory 19 and can be selected by an operator and possibly modified. In the present case, the sequence control module 14 is configured such that an arbitrary echo pulse sequence can be carried out for acquiring the first and second echo data $RD_1$, $RD_2$.

For the output of the individual RF pulses, the central computer 13 has a radio-frequency transmitting device 15 that generates the RF pulses, amplifies them and feeds them by a suitable interface (not shown) to the RF transmitter antenna system 5. In order to control the gradient coils of the gradient coil arrangement 6, the control computer 13 has a gradient interface 16. The sequence control module 14 communicates in a suitable manner, for example, by transmission of sequence control data SD, with the radio-frequency transmitting device 15 and the gradient interface 16 for transmission of the echo pulse sequence. The control computer 13 also has a radio-frequency receiving device 17 (also communicating in a suitable manner with the sequence control module 14) in order to acquire magnetic resonance signals, i.e. the echo data $RD_1$, $RD_2$ in a coordinated manner from the RF transmitter antenna 7.

In the present case, the central control computer 13 has an image processor 20 according to the invention that can be realized, for example, in the form of software on a computer of the central control computer 13, for example, a microcontroller or the like. This image processor 20 accepts the acquired echo data $RD_1$, $RD_2$ by an interface 11. From these echo data $RD_1$, $RD_2$, the first and second sets of image data $S_1$, $S_2$ of the defined region ROI, from which the echo data $RD_1$, $RD_2$ were acquired, are then reconstructed in a conventional manner by a typical image reconstruction computer 12. These first and second sets of image data $S_1$, $S_2$ are then passed to a phase value computation unit 21 which is configured to establish an energy function $E(\varphi)$ that contains at least one term which places the phase-describing values of image points or image point groups of the phase-describing map into relation and depends on a difference of the phase-describing values of the respective image points or image point groups. In this exemplary embodiment, the and phase value computation unit 21 has an optimizing unit 23 which is configured to optimize the energy function for obtaining an optimized phase-describing map $\Phi(x)$, making use of a min-cut/max-flow method.

Furthermore, the first and second sets of image data $S_1$, $S_2$ and the phase-describing map $\Phi(x)$ are finally passed on to an image computation unit 22 which can determine the separate image data W and F for the two chemical substance types, for example, water and fat in the region defined as of interest ROI, on the basis of the phase-describing map $\Phi(x)$ and on the basis of the first and second image data $S_1$, $S_2$, as described in relation to method step VII of FIG. 1.

Operation of the central control computer 13 can take place via a terminal with an input interface 10 and a display monitor 9, via which the entire MR system 1 can thus also be operated by a technician. On the display monitor 9, MR images, particularly the fat and water image data, can also be individually displayed and, via the input interface 10, if required, in combination with the display monitor 9, scans can be planned and started.

Thus the MR system 1 according to the invention and, in particular, the control computer 13 can also have a number of further components not described herein in detail, but that are usually present on such devices. This includes, for example, a network interface in order to connect the entire system to a network and to be able to exchange raw data and/or image data or parameter maps, as well as further data, for example, patient-relevant data or control protocols and to be able to store these in external memory stores for archiving and possibly for later output. For completeness, it should also be mentioned that the use of the indefinite article "a" or "an" does not preclude the relevant feature from also being present plurally. Similarly, the expression "unit" does not preclude such an entity from being composed of multiple components that may possibly be spatially distributed.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a phase-describing, map in a form that is usable to generate magnetic resonance (MR) image data, said method comprising:

operating an MR scanner, while an examination subject is situated therein, to acquire a plurality of data sets comprising, at a minimum, first and second sets of magnetic resonance echo raw data from a region of the examination subject, respectively at a minimum of two different echo times, said first and second sets of magnetic resonance echo raw data originating from two different chemical substance types;

providing said first and second sets of magnetic resonance echo raw data to a processor and, in said processor, reconstructing a first image data set of the defined region from the first set of magnetic resonance echo raw data and reconstructing a second set of image data of the defined region from the second set of magnetic resonance echo raw data;

in said processor, establishing an energy function that contains at least one term that places phase-describing values of map points of a phase-describing map in relation to each other dependent on a difference of the respective phase-describing values of the respective map points; and in said processor, optimizing the energy function to obtain an optimized phase-describing map, using, a min-cut/max-flow method, and making the optimized phase-describing map available in electronic form as a data file from said processor.

2. A method as claimed in claim 1 comprising, before optimizing said energy function, placing said energy function in a form in said processor that is optimizable with a known min-cut/max-flow method.

3. A method as claimed in claim 1 comprising selecting said energy function from the group consisting of convex functions and submodular functions.

4. A method as claimed in claim 1 comprising optimizing said energy function by executing said min-cut/max-flow method as an iterative procedure comprising a plurality of iterations and, in each iteration, defining the phase-describing values according to a predetermined modification schema, until no further phase change is discernable in a current iteration compared to an immediately preceding iteration.

5. A method as claimed in claim 4 comprising employing respectively different modification schemas respectively in the respective iterations.

6. A method as claimed in claim 5 comprising executing said iterations with respective modification schemas comprising a pattern:

jump to a next larger permitted phase;
   jump to a next smaller permitted phase;
   jump to a next larger minimum of the energy function;
   jump to a next smaller minimum of the energy function;
   increase by $2\pi$;
   decrease by $2\pi$;
   increase by a predetermined increment;
   decrease by a predetermined increment; and
   jump by $2\pi$ to a next-but-one neighbor point.

7. A method as claimed in claim 1 comprising establishing said energy function to comprise a term that represents a square of a phase difference between adjacent map points.

8. A method as claimed in claim 1 comprising optimizing the energy function using a start map comprising starting values, and respectively determining said starting values as phase-describing candidate values.

9. A method as claimed in claim 1 comprising establishing said energy function to comprise a term that represents a local data consistency of a phase-describing value.

10. A method as claimed in claim 1 comprising providing said optimized phase-describing map to a reconstruction processor and, in said reconstruction processor, applying said optimized phase-describing map to said first set of image data to generate image data of said region for a first chemical substance type of said two chemical substance types, and applying said phase-describing map to said second set of image data to generate image data of said region for a second chemical substance type of said two chemical substance types.

11. A method as claimed in claim 10 comprising determining said image data for said first and second chemical substance types by executing an optimization procedure.

12. An image processing device for generating a phase-describing map in a form that is usable to generate magnetic resonance (MR) image data, said method comprising:

a computer having an interface that receives data acquired by operating an MR scanner, while an examination subject is situated therein, as a plurality of data sets comprising, at a minimum, first and second sets of magnetic resonance echo raw data from a region of the examination subject, acquired respectively at a minimum of two different echo times, said first and second sets of magnetic resonance echo raw data originating from two different chemical substance types;

said computer comprising a processor configured to reconstruct a first image data set of the defined region from the first set of magnetic resonance echo raw data and reconstruct a second set of image data of the defined region from the second set of magnetic resonance echo raw data;

said processor being configured to establish an energy function that contains at least one term that places phase-describing values of map points of a phase-describing map in relation to each other dependent on a difference of the respective phase-describing values of the respective map points; and said processor being configured to optimize the energy function to obtain an optimized phase-describing map, using a min-cut/max-flow method, and making the optimized phase-describing map available in electronic form as a data file from said processor.

13. A magnetic resonance (MR) apparatus comprising:

an MR scanner;

a control computer configured to operate said MR scanner, while an examination subject is situated therein, to acquire a plurality of data sets comprising, at a minimum, first and second sets of magnetic resonance echo raw data from a region of the examination subject, respectively at a minimum of two different echo times, said first and second sets of magnetic resonance echo raw data originating from two different chemical substance types;

a processor provided with said first and second sets of magnetic resonance echo raw data, said processor being configured to reconstruct a first image data set of the defined region from the first set of magnetic resonance echo raw data and to reconstruct a second set of image data of the defined region from the second set of magnetic resonance echo raw data;

said processor being configured to establish an energy function that contains at least one term that places phase-describing values of map points of a phase-describing map in relation to each other dependent on a difference of the respective phase-describing values of the respective map points; and said processor being configured to optimize the energy function to obtain an optimized phase-describing map, using a min-cut/max-flow method, and to apply said optimized phase-describing map to said first image data set to generate image data of said region for a first chemical substance type of said two chemical substance types, and to apply said phase-describing map to said second image data set to generate image data of said region for a second chemical substance type of said two chemical substance types.

14. A non-transitory, computer-readable data storage medium encoded with programming instructions, said storage medium being loaded into a control and reconstruction computer of a magnetic resonance (MR) apparatus comprising an MR scanner, and said programming instructions causing said control and reconstruction computer to:

operate an MR scanner, while an examination subject is situated therein, to acquire a plurality of data sets comprising, at a minimum, first and second sets of magnetic resonance echo raw data from a region of the examination subject, respectively at a minimum of two different echo times, said first and second sets of magnetic resonance echo raw data originating from two different chemical substance types;

reconstruct a first image data set of the defined region from the first set of magnetic resonance echo raw data and reconstructing a second set of image data of the defined region from the second set of magnetic resonance echo raw data;

establish an energy function that contains at least one term that places phase-describing values of map points of a phase-describing map in relation to each other dependent on a difference of the respective phase-describing values of the respective map points; and optimize the energy function to obtain an optimized phase-describing map, using a min-cut/max-flow method, and apply said optimized phase-describing map to said first image data set to generate image data of said region for a first chemical substance type of said two chemical substance types, and applying said phase-describing map to said second image data set to generate image data of said region for a second chemical substance type of said two chemical substance types.

* * * * *